(12) United States Patent
Oberg

(10) Patent No.: US 7,286,065 B1
(45) Date of Patent: *Oct. 23, 2007

(54) METHOD AND APPARATUS FOR DC-LEVEL CONSTRAINED CODING

(75) Inventor: Mats Oberg, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 290 days.

This patent is subject to a terminal disclaimer.

(21) Appl. No.: 11/166,425

(22) Filed: Jun. 24, 2005

Related U.S. Application Data

(63) Continuation of application No. 10/695,531, filed on Oct. 28, 2003, now Pat. No. 6,917,314, which is a continuation of application No. 10/053,885, filed on Jan. 16, 2002, now Pat. No. 6,661,356.

(60) Provisional application No. 60/273,357, filed on Mar. 5, 2001.

(51) Int. Cl.
*H03M 7/00* (2006.01)

(52) U.S. Cl. .......................... 341/58; 360/40
(58) Field of Classification Search ................ 341/58, 341/59; 369/59.23, 59.24; 360/40, 48
See application file for complete search history.

(56) References Cited

U.S. PATENT DOCUMENTS

| 4,675,650 A | 6/1987 | Coppersmith et al. |
| 4,888,779 A | 12/1989 | Karabed et al. |
| 5,144,304 A | 9/1992 | McMahon et al. |
| 5,375,249 A | 12/1994 | Cho |
| 5,396,239 A | 3/1995 | McMahon et al. |
| 5,537,424 A | 7/1996 | Karabed et al. |
| 5,608,397 A | 3/1997 | Solkanin |
| 5,636,033 A | 6/1997 | Maeda |
| 5,757,822 A | 5/1998 | Fisher et al. |
| 5,910,696 A | 6/1999 | Kang |
| 6,018,304 A | 1/2000 | Bessios |
| 6,046,691 A | 4/2000 | Aziz et al. |
| 6,097,320 A | 8/2000 | Kuki et al. |
| 6,184,806 B1 | 2/2001 | Patapoutian et al. |
| 6,198,413 B1 | 3/2001 | Widmer |
| 6,204,781 B1 | 3/2001 | Aziz et al. |
| 6,297,753 B1 * | 10/2001 | Hayami ........................ 341/59 |
| 6,366,223 B1 | 4/2002 | Lee et al. |

FOREIGN PATENT DOCUMENTS

EP  1058432 A2  6/2000

OTHER PUBLICATIONS

Nan-Hsiung Yeh, "Equivalence of Signal Processing in Perpendicular and Longitudinal Recordings" Digests of PMRC 2000, The Fifth Perpendicular Magnetic Recording Conference, (Sendai, Japan) Oct. 23-26, 2000, p. 231.

* cited by examiner

*Primary Examiner*—Howard L. Williams

(57) ABSTRACT

A method and apparatus reduces a DC level of an input word. The input word is divided into a plurality of components that include n symbols. The n symbols of the components are summed for each component. The component is encoded into a substitute component if a sum for the component exceeds a threshold. The components having a sum that does exceed the threshold are combined with at least one substitute component into an output word. An output word template is selected based on a number of substitute components and on a position that the substitute components originally occupied in the input word. The substitute components are inserted in the output word template. The components that have a sum that does not exceed the threshold are inserted in the output word template. Address and indicator symbols are inserted in the output word.

37 Claims, 9 Drawing Sheets

| "Bad Code Words" | Indicator | Address | Code Word |
|---|---|---|---|
| - | - | - | {A,B,-1,C,D} |
| A | 1 | -1,-1 | {B,1,-1,-1,Enc(A),1,C,D} |
| B | 1 | -1,1 | {A,1,-1,1,Enc(B),1,C,D} |
| C | 1 | 1,-1 | {A,1,-1,-1,Enc(C),1,B,D} |
| D | 1 | 1,1 | {A,1,-1,-1,Enc(D),1,B,C} |
| A,B | -1,1,-1 | 1,-1,-1 | {C,-1,1,-1,Enc(A),1,1,-1,-1,Enc(B),D} |
| A,C | -1,1,-1 | -1,1,-1 | {B,-1,1,-1,Enc(A),1,-1,1,-1,Enc(C),D} |
| A,D | -1,1,-1 | -1,-1,1 | {B,-1,1,-1,Enc(A),1,-1,-1,1,Enc(D),C} |
| B,C | -1,1,-1 | 1,1,-1 | {A,-1,1,-1,Enc(B),1,1,1,-1,Enc(C),D} |
| B,D | -1,1,-1 | 1,-1,1 | {A,-1,1,-1,Enc(B),1,1,-1,1,Enc(D),C} |
| C,D | -1,1,-1 | -1,1,1 | {A,-1,1,-1,Enc(C),1,-1,1,1,Enc(D),B} |
| A,B,C | -1,1,1,-1 (3) | 1,1 | {Enc(A),-x,1,1,-1,-1,1,Enc(B),1,-1,-x,Enc(C),D} |
| A,B,D | -1,1,1,-1 (3) | 1,-1 | {Enc(A),-x,1,-1,-1,-1,1,Enc(B),1,-1,-x,Enc(D),C} |
| A,C,D | -1,1,1,-1 (3) | -1,1 | {Enc(C),-x,-1,1,-1,-1,1,Enc(C),1,-1,-x,x,Enc(D),B} |
| B,C,D | -1,1,1,-1 (3) | -1,-1 | {Enc(B),-1,-1,-1,-1,-1,1,Enc(C),1,-1,-x,x,Enc(D),A} |
| A,B,C,D | -1,1,1,1,1 (8) | - | {Enc(A),1,-1,-1,-1,1,1,Enc(B),1,1,-x,x,Enc(C),Enc(D),x,x} |

FIG. 6

| Input Byte | Output Word |
|---|---|
| 1,1,1,1,1,1,1,-1 | 1,-1,1,1,-1,1 |
| 1,1,1,1,1,1,-1,1 | 1,-1,1,1,1,-1 |
| 1,1,1,1,-1,-1,1,1 | -1,1,1,1,1,-1 |
| 1,1,1,-1,-1,1,1,1 | 1,1,1,-1,-1,-1 |
| 1,1,1,-1,1,1,1,1 | 1,1,-1,-1,1,-1 |
| 1,1,-1,1,1,1,1,1 | 1,1,-1,1,-1,1 |
| 1,-1,1,1,1,1,1,1 | -1,1,1,1,-1 |
| -1,1,1,1,1,1,1,1 | -1,1,1,1,-1,1 |
| 1,1,1,1,1,1,1,1 | -1,1,-1,1,1,1 |
| 1,-1,1,-1,-1,-1,1,-1 | 1,-1,-1,1,1,1 |

FIG. 7 ized by the alphabet $\{1,-\}$.
METHOD AND APPARATUS FOR DC-LEVEL CONSTRAINED CODING

CROSS-REFERENCE TO RELATED APPLICATIONS

This application is a continuation of U.S. patent application Ser. No. 10/695,531, filed on Oct. 28, 2003 now U.S. Pat. No. 6,917,314, which is a continuation of U.S. patent application Ser. No. 10/053,885, filed on Jan. 16, 2002 now U.S. Pat. No. 6,661,356, which claims the benefit of U.S. Provisional Application No. 60/273,357, filed Mar. 5, 2001, which is hereby incorporated by reference.

FIELD OF THE INVENTION

The present invention relates to encoders and decoders, and more particularly to DC-level constrained coding and decoding.

BACKGROUND OF THE INVENTION

In magnetic recording media, such as hard disks for computers, a transducer is positioned adjacent to a magnetic recording media. In longitudinal recording, the transducer records data by magnetizing the magnetic recording media in a longitudinal direction. In other words, the transducer magnetizes parallel to the direction of relative movement between the magnetic medium and the transducer. In perpendicular recording, the transducer records data by magnetizing the magnetic recording media in a perpendicular direction.

Computers manipulate information using binary symbols that include the alphabet $\{1,0\}$. When writing to the magnetic media, computers magnetize the magnetic media in opposite magnetic directions. To more accurately reflect the bipolar physical magnetization, the information signals are represented by the alphabet $\{1,-\}$.

Each bit storage location on a disk drive is a magnetic domain that includes a number of grains, which are crystals of magnetic material. Perpendicular recording allows a smaller grain size than longitudinal recording before encountering a superparamagnetic effect. Perpendicular recording allows tracks that are more narrow and well defined than those in longitudinal recording. In other words, perpendicular recording allows significantly higher areal densities.

The write signals in longitudinal and perpendicular recording are also different. Referring now to FIG. 1, a write signal 10 in longitudinal recording is normally at a DC null 12. The write signal 10 transitions from the DC null 12 to +a or −a during a transition 14 and returns to the DC null 12 until a subsequent transition occurs. In perpendicular recording, however, a write signal 16 transitions between +a or −a. In other words, the write signal 16 does not return to the DC null 12.

In perpendicular recording, a preamplifier and input AC coupling introduces DC distortion. The distortion is monitored and compensation is provided. As the number of consecutive a's or −a's increases, a DC offset of the perpendicular recorder tends to drift. In addition, the number of alternating transitions between adjacent symbols should be limited to the extent possible.

SUMMARY OF THE INVENTION

A method and apparatus according to the present invention constrains a DC level of an input word. The input word is divided into a plurality of components that include n symbols. The n symbols are summed for each component. The sum is compared to a threshold. The component is encoded into a substitute component if the sum for the component exceeds the threshold. The components having the sum that does not exceed the threshold are combined with at least one substitute component into an output word.

In other features of the invention, the substitute component includes less than n symbols. The input word includes 32 symbols and the output word includes at least 33 symbols. The components include 8 symbols and the substitute component includes 5 symbols.

In still other features, an output word template is selected based on a number of substitute components and based upon a position that the substitute components originally occupied in the input word. The substitute components are inserted in the output word based on the output word template. The components that have the sum that does not exceed the threshold are inserted in the output word based on the output word template. Address and indicator symbols are inserted in the output word.

In other features, a parity symbol is added to the output word to make a product of symbols of the output word positive or negative.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 5 is a table illustrating exemplary indicators for different numbers of bad components;

FIG. 6 is a table for mapping output words for various bad components;

FIG. 7 is a table for mapping bad components to shorter substitute components;

DETAILED DESCRIPTION OF THE PREFERRED EMBODIMENTS

The following description of the preferred embodiment(s) is merely exemplary in nature and is in no way intended to limit the invention, its application, or uses.

Figure 1:
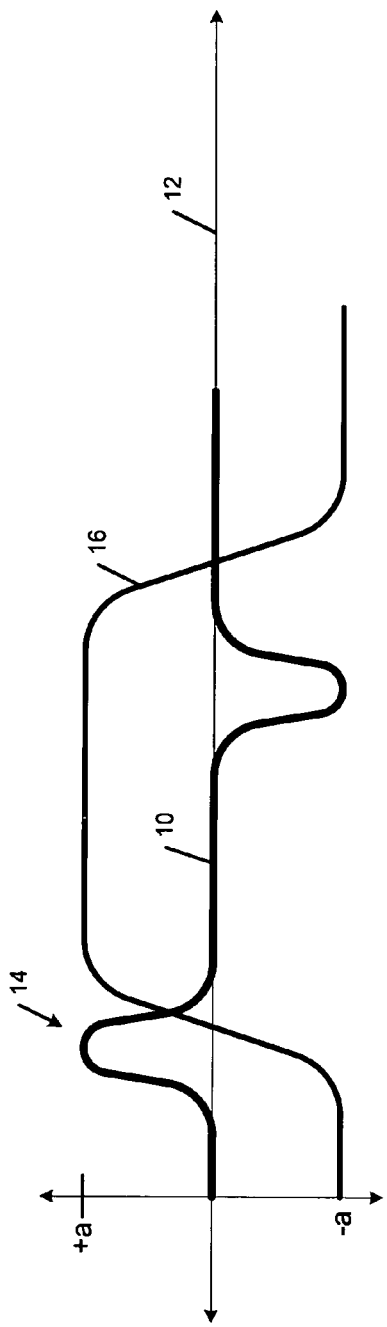
FIG. 1 is a graph illustrating write signals for longitudinal and perpendicular recording on magnetic media according to the prior art.
Figure 2:
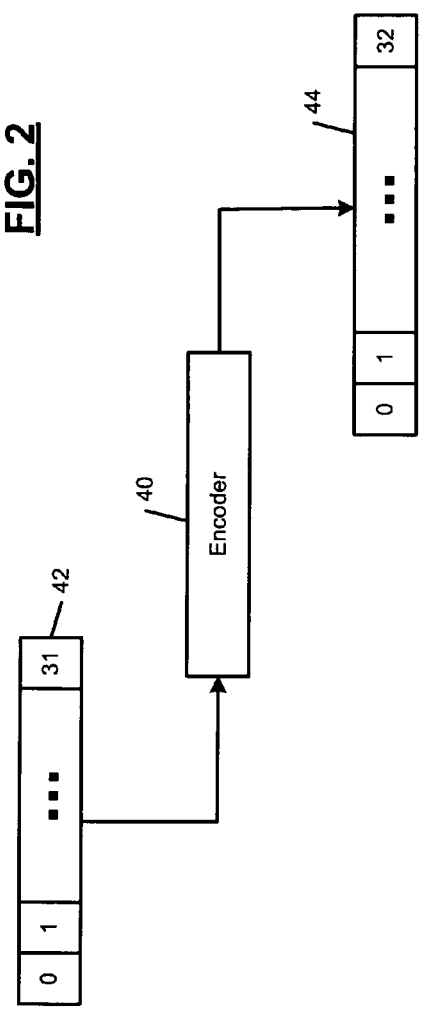
FIG. 2 is a block diagram illustrating a DC-constrained encoder according to the present invention.

Referring now to FIG. 2, a DC-level constrained encoder 40 maps an encoder input word 42 into an encoder output word 44. The output word 44 contains one or more additional symbols than the input word 42. The present invention will be described with the input word 42 having 32 symbols. The present invention will also be described with the output word 44 having 33 or 34 symbols. Skilled artisans will appreciate that the present invention has application to input words and output words having other lengths and other differential lengths.

The output word 44 contains 33 symbols that are selected from an alphabet defined by $A = \{-1, 1\}$. The output word 44 has at most 13 consecutive symbols that are the same. Any set of 33 consecutive symbols has a digital sum between −21 and 21. The digital sum over the output word 44 is between −17 and 17. As can be appreciated, the DC-level constrained encoder 40 of the present invention constrains the DC level of the output word 44. The longest run of continuous transitions is 22. A parity symbol can optionally be added to the output word 44 as will be described more fully below.

Figure 3:
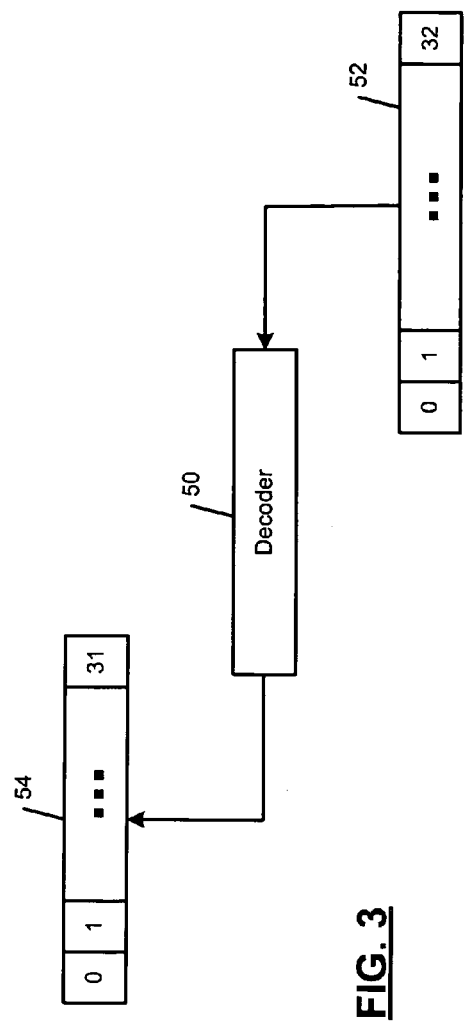
FIG. 3 is a block diagram illustrating a decoder according to the present invention.
Figure 4:
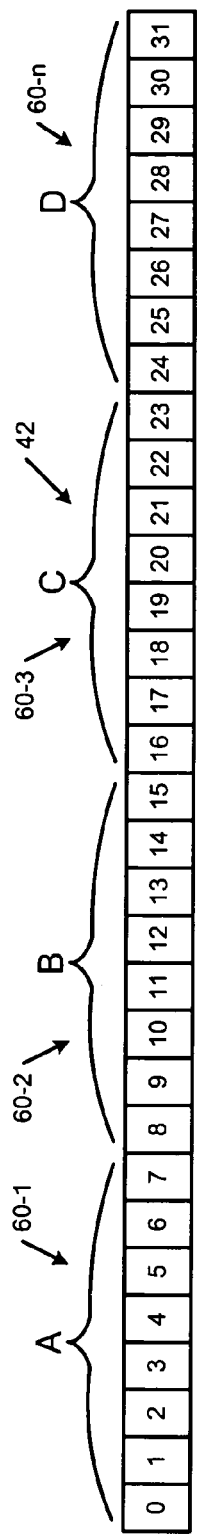
FIG. 4 illustrates a word that is divided into components that include multiple symbols.

Referring now to FIG. 3, a decoder 50 reverses the operation of the encoder 40. In other words, the decoder 50 maps encoded output word 52 into a decoded input word 54. Referring now to FIG. 4, the input word 42 is divided into a plurality of components that are labeled A, B, C, and D. Each component includes multiple symbols. In the exemplary embodiment, the input word 42 includes 32 symbols. The input word 42 is divided into four components that are labeled A, B, C. and D. In other words, A includes $\{u_0, u_1, \ldots, u_7\}$, B includes $\{u_8, u_9, \ldots, u_{15}\}$, C includes $\{u_{16}, u_{17}, \ldots u_{23}\}$, and D includes $\{u_{24}, u_{17}, \ldots u_{31}\}$.

A component digital sum is the sum of the individual symbols in the component. For example, if $A = \{1,1,1,1,1,1,1,1\}$, the component digital sum of A is equal to 8. The encoder 40 classifies the components as good or bad. If a component is a good component, the component is inserted without modification into the output word 44. If a component is a bad component, the component is encoded into a shorter substitute component and inserted into the output word 44. For example, an 8-symbol component that is bad is encoded into a 5-symbol substitute component.

When each component includes a byte, the component is considered to be bad if it has a component digital sum with an absolute value that is greater than a threshold such as 4. With this threshold, any component that includes more than six 1's or six −1's is automatically a bad component. Additional types of components may also be defined as being bad components to alleviate other problems such as an extended number of symbols with alternating signs. In other words, components having an alternating sign every other symbol are considered bad components. Based on the above example, there are 20 combinations that are bad components. The remaining 236 combinations are good components.

Referring now to FIG. 5 and continuing with the example, for a given 32 symbol input word 42, there can be 0, 1, 2, 3 or 4 bad components. A good component is inserted "as is" into the output word 44 and bad components are encoded into shorter substitute components having 5 symbols. Therefore, 32, 29, 26, 23 or 20 symbols are required to encode input words 42 with 0, 1, 2, 3 or 4 bad components, respectively. There are 1, 4, 7, 10, or 13 symbols, respectively, that can be used to indicate the combination of components that are encoded.

Referring now to FIG. 6, an example mapping of good and bad components to the output words 44 for an exemplary implementation of the DC-constrained encoder 40 is shown. The map defines one way to select address and indicator symbols based on the position and number of bad components in the input word 42. The map also shows one way to position the address and indicator symbols in the output word 44. The address symbols are used to identify the substitute components that are encoded. The indicator symbols are used to indicate the number of components that are encoded.

When there are 0 bad components in the input word 42, an indicator symbol is set equal to a first predetermined value and is placed in a particular symbol location in the output word 44. For example, the indicator symbol is set equal to −1 and is located in the center of the output word, e.g. $y_{16} = -1$. Other positions and values can be employed. If there are one or more bad components, the indicator symbol is set equal to a second predetermined value such as $y_{16}=1$. The indicator symbols defined by "x" can be selected freely. However, the "x" symbols should be selected to limit the DC level of the output word 44 and the total number of consecutive transitions in the output word 44.

To help the decoder 50 identify the good and substitute components of the encoded output word 44, one, two or three address symbols are employed. If one component of the input word 42 is bad, a two symbol address is used. If two components of the input word 42 are bad, a three symbol address is used. If three components are bad, a two symbol address is used to indicate the symbols that are not encoded. If four bytes are encoded, the addressing is redundant.

Referring now to FIG. 7, an encoder table for coding an 8-symbol bad component into the 5-symbol substitute component is shown. While the exemplary embodiment employs a lookup table, other mapping functions may be used. As can be appreciated, only bad components with positive values are included in the table. If the bad components have a negative component digital sum, the inverse of the encoder table is used. Alternately, the table can include components with negative component digital sums. If the component digital sum is equal to 0, then the sign is preferably decided by a first symbol in the argument although other default schemes may be used.

The decoder 50 initially checks the indicator symbol such as $y_{16}$. If $y_{16}$ is equal to the first predetermined symbol (such as −1), then none of the components are encoded. Otherwise, the decoder 50 checks the other indicator symbols and decodes the substitute components.

A single parity check symbol can optionally be added to the output word 44. For example, the addition of a parity symbol at the end of the output word 44 is used to make sure that the product of the symbols in the output word is positive. The addition of a parity bit at the end of each output word 44 gives a code rate of 32/34. With this additional parity symbol, any set of 34 consecutive code symbols has a digital sum between −22 and 22. A running digital sum of the output word 44 is between −19 and 17. If the parity check symbol is added such that the product of the symbols and the output word is negative, the block digital sum is between −16 and 16.

Figure 8:
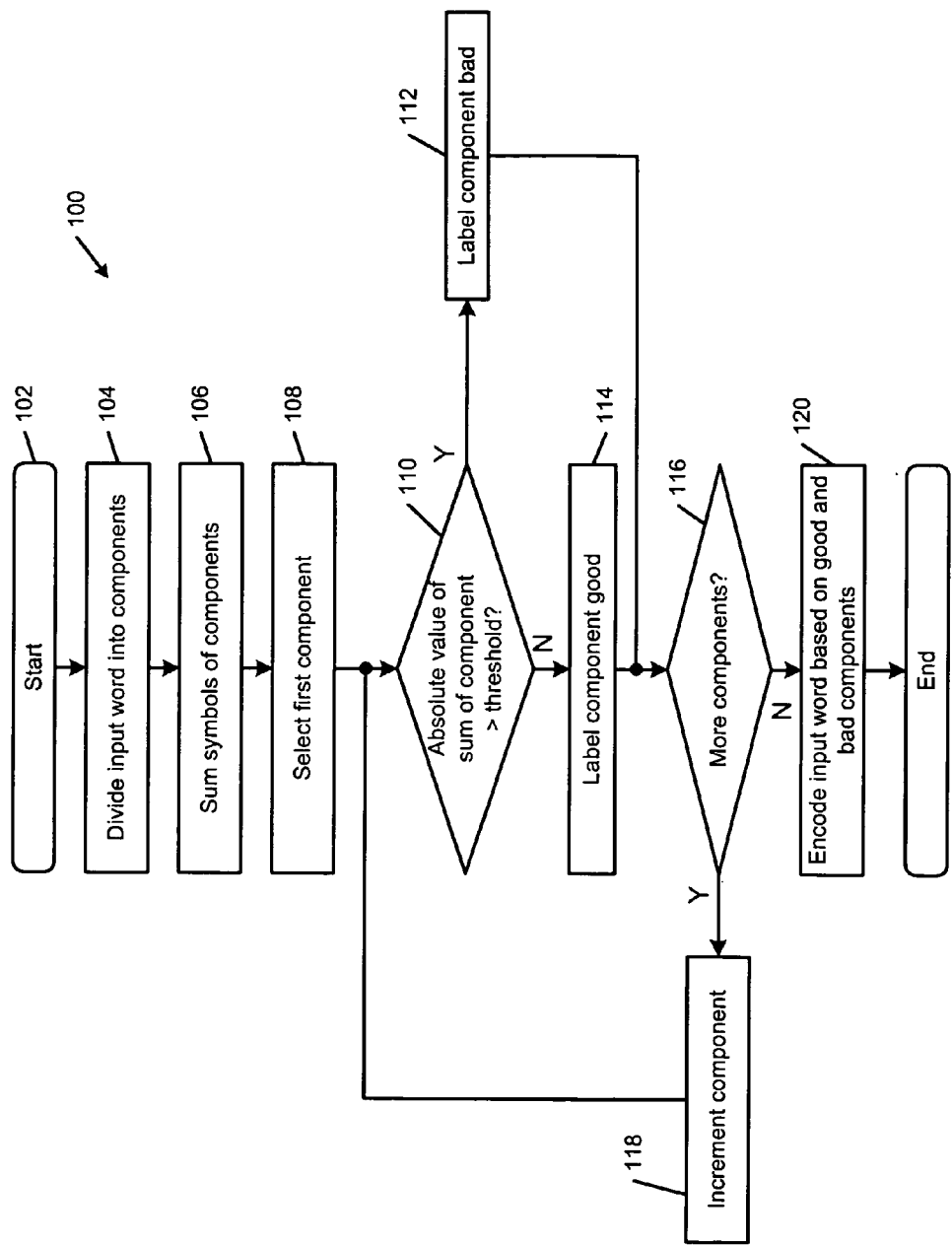
FIGS. 8 and 9 are flowcharts illustrating steps for encoding that are performed by the DC-constrained encoder of FIG. 2.

Referring now to FIG. 8, steps for encoding the input word 42 are shown generally at 100. In step 102, control begins. In step 104, the encoder 40 divides the input word 42 into a plurality of equal-length components. Each component includes n symbols. In step 106, the encoder 40 sums the symbols of each component. In step 108, the encoder 40 selects a first component. In step 110, the encoder 40 compares an absolute value of the sum of the symbols of the selected component to a threshold. If the absolute value of the sum is greater than the threshold, the encoder 40 designates the selected component bad in step 112. Otherwise, the encoder 40 labels the selected components good in step 114. In step 116, the encoder 40 determines whether there are any more components. If there are additional components in the input word 42, the encoder 40 increments the component and continues with step 110. Otherwise, the encoder 40 encodes the input word 42 based on the number and position of the good and bad components in step 120.

Figure 9:
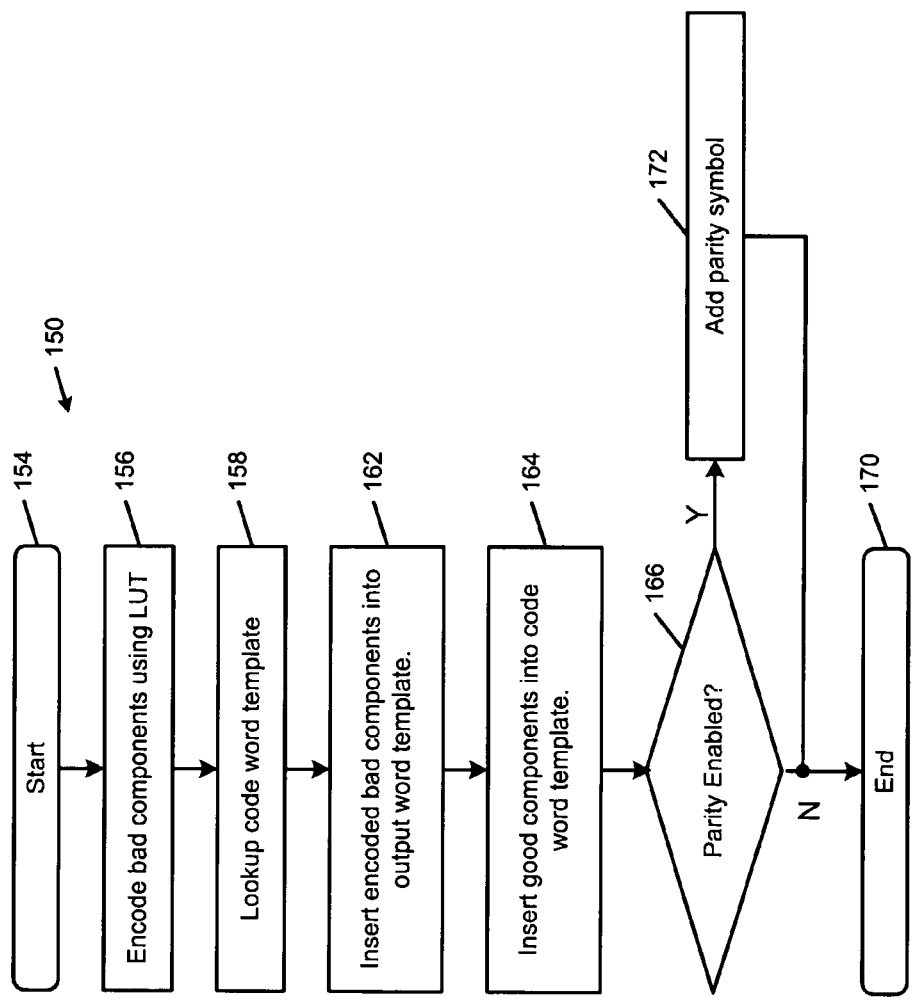

Referring now to FIG. 9, steps performed by the encoder 40 in step 120 are shown generally at 150. Control begins at step 154. In step 156, the encoder 40 generates substitute components for the bad components using a lookup table or other function. In step 158, the encoder 40 looks up a code or output word template based upon the number and position of the good and bad components in the input word 42. In step 162, the encoder 40 inserts substitute components into the output word template. In step 164, the encoder 40 inserts the good components into the output word template. In step 166, the encoder 40 determines whether a parity function is enabled. If not, control ends at step 170. Otherwise control continues with step 172 and a parity symbol is added as previously discussed above.

Figure 10:
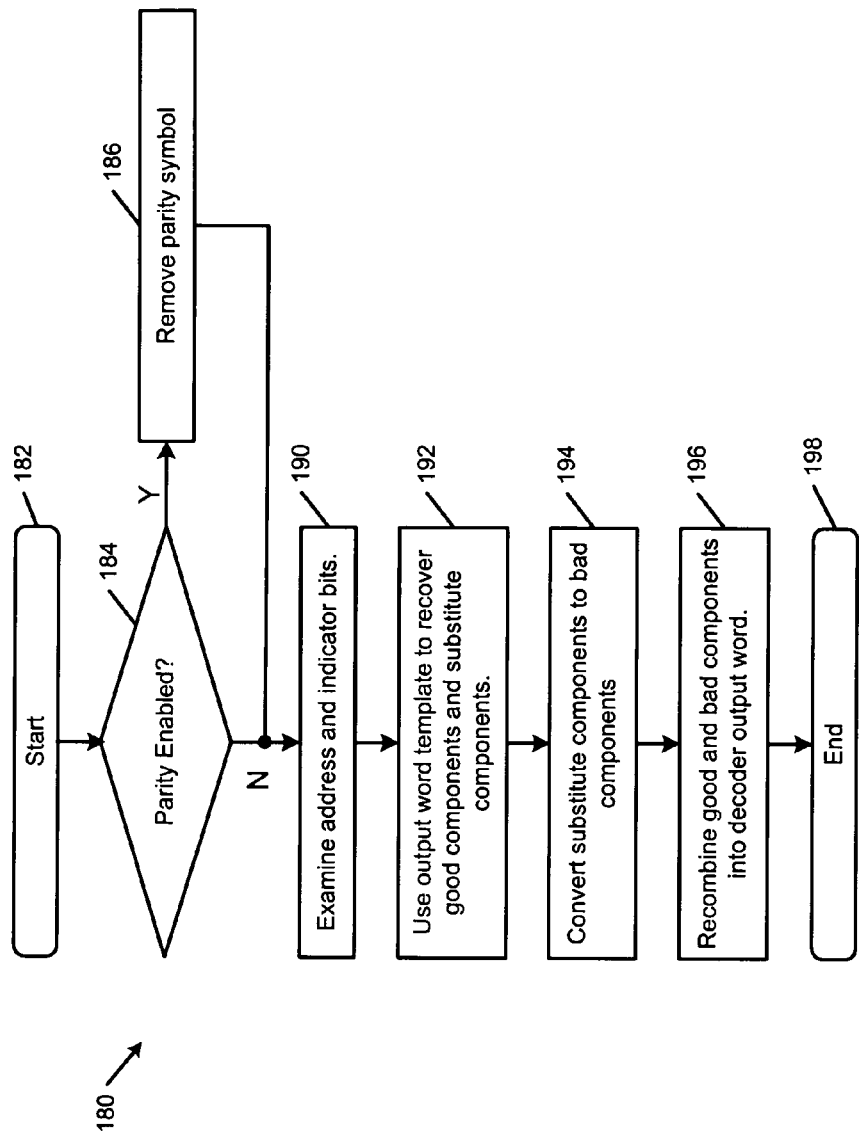
FIG. 10 is a flowchart illustrating steps for decoding that are performed by the decoder of FIG. 3.

Referring now to FIG. 10, steps for decoding are shown generally at 180. Control begins in step 182. In step 184, the decoder determines whether parity is enabled. If it is, control continues with step 186 where the decoder removes the parity symbol(s) from the decoder input word and continues with step 190. If parity is disabled, control continues with step 190 where the address and indicator bits are examined by the decoder. In step 192, the decoder uses the output word template to recover the good and bad components based on the address and indicator bits. In step 194, the decoder converts substitute components to bad components. In step 196, the decoder recombines good and bad components into the decoder output word.

Figure 11:
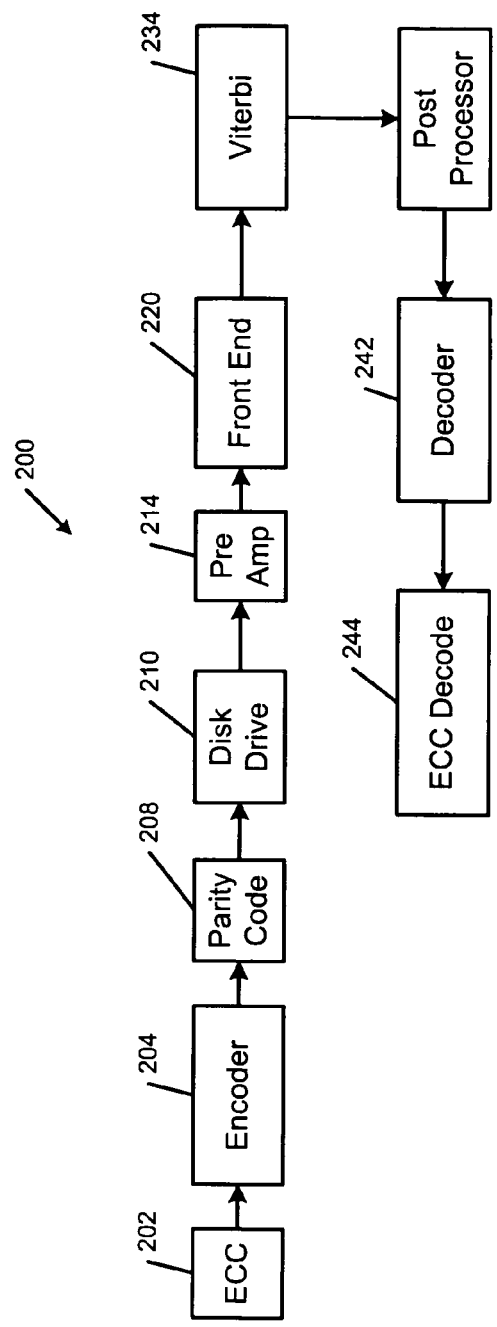
FIG. 11 is a functional block diagram of the encoder of FIG. 2 implemented in an exemplary application for perpendicular recording on magnetic media.
Figure 12:
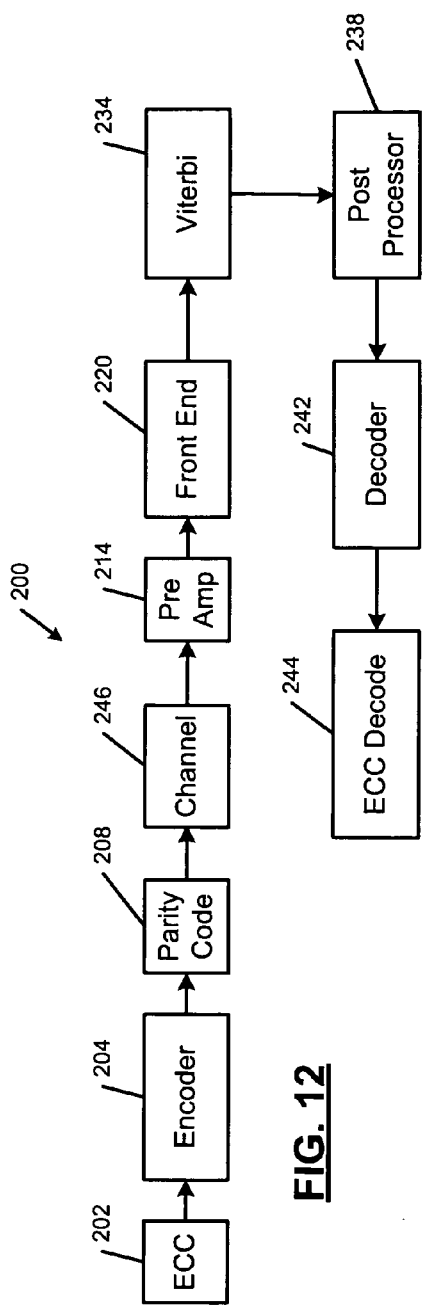
FIG. 12 is a functional block diagram of the encoder of FIG. 2 implemented in an exemplary application including an output channel.

Referring now to FIG. 11, a perpendicular recorder for a magnetic media is shown generally at 200. The perpendicular encoder 200 includes an encoder and decoder according to the present invention. An error correction coding (ECC) circuit 202 is connected to an encoder 204. A parity code circuit 208 is connected to an output of the encoder 204 or is integrated with the encoder 204. Likewise the ECC 202 can be integrated with the encoder 204. Data is written to a disk drive 210. A preamp 214 reads the data from the disk drive 210. A front end 220 is connected to an output of the preamp 214. A Virterbi coder 234 is connected to an output of the front end 220. An output of the Viterbi coder 234 is connected to a post processor 238. A decoder 242 is connected to an output of the post processor 238. An error correction decoding circuit 244 is connected to an output of the decoder 242. Reference numbers from FIG. 11 are used in FIG. 12 to identify similar elements. Skilled artisans will appreciate that the disk drive 210 in FIG. 10 can be replaced by a communications channel 246 connected to an output media such as a wireless local area network, an Ethernet, or any other communications channel.

Figure 13:
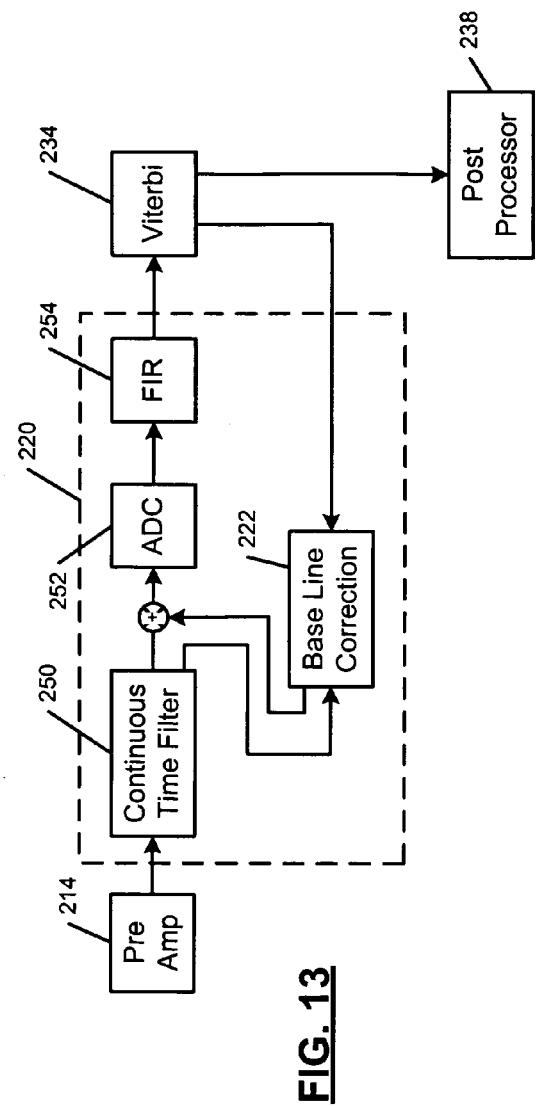
FIG. 13 is a functional block diagram of an exemplary front end for the encoders of FIGS. 11 and 12.

Referring now to FIG. 13, an exemplary front end 220 is shown in further detail. A continuous time filter 250 is connected to an output of the preamp 214. An output of the continuous time filter 250 is input to a base line correction circuit 252 and to an adder 254. An output of the base line correction circuit 252 is also output to the adder 254. An output of the adder 254 is input to an analog to digital converter (ADC) 256. An output of the ADC 256 is connected to a finite impulse response (FIR) filter 258. An output of the FIR filter 258 is connected to the Viterbi coder 234 with outputs connected to the base line correction circuit 252 and the post processor 238.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A method that constrains a DC level of an input word, comprising:
    summing n symbols of components of said input word and generating a sum for each component;
    comparing said sum to a threshold;
    encoding said component into a substitute component if said sum for said component exceeds said threshold; and
    one of combining said components having said sum that does not exceed said threshold with at least one substitute component into an output word and outputting said input word as said output word if at least one substitute component is not generated.

2. The method of claim 1 wherein said substitute component includes less than n symbols.

3. The method of claim 1 wherein said input word includes 32 symbols and said output word includes at least 33 symbols.

4. The method of claim 3 wherein said components include 8 symbols, said threshold is 4 and said substitute component includes 5 symbols.

5. The method of claim 1 further comprising:
    selecting an output word template based on a number of substitute components and based on a position that said substitute components originally occupied in said input word;
    inserting said substitute components in said output word based on said output word template; and
    inserting said components that have said sum that does not exceed said threshold in said output word based on said output word template.

6. The method of claim 5 further comprising inserting address symbols in said output word based on said output word template.

7. The method of claim 5 further comprising inserting indicator symbols in said output word based on said output word template.

8. The method of claim 1 further comprising adding a parity symbol to said output word to make a product of symbols of said output word positive.

9. The method of claim 1 further comprising adding a parity symbol to said output word to make a product of symbols of said output word negative.

10. The method of claim 1 wherein said symbols are in an alphabet $\{1, -1\}$ and wherein said output word has a sum between $-17$ and $17$.

11. The method of claim 1 further comprising at least one of encoding said component into a substitute component if said symbols of said component alternate between a positive value and a negative value over said n symbols and encoding said component into a substitute component if said symbols of said component alternate between a negative value and a positive value over said n symbols.

12. The method of claim 1 wherein said output word is output to a perpendicular recorder in a data storage system.

13. A DC-level constraining circuit that constrains a DC level of an input word, comprising:
   summing means for summing n symbols of components of said input word and for generating a sum for each component;
   comparing means for comparing said sum to a threshold;
   encoding means for encoding said component into a substitute component if said sum for said component exceeds said threshold; and
   combining means for one of combining said components having said sum that does not exceed said threshold with at least one substitute component into an output word and outputting said input word as said output word if at least one substitute component is not generated.

14. The DC-level constraining circuit of claim 13 wherein said substitute component includes less than n symbols.

15. The DC-level constraining circuit of claim 13 wherein said input word includes 32 symbols and said output word includes at least 33 symbols, said components include 8 symbols, said threshold is 4, and said substitute component includes 5 symbols.

16. The DC-level constraining circuit of claim 13 wherein said encoding means selects an output word template based on a number of substitute components and based on a position that said substitute components originally occupied in said input word.

17. The DC-level constraining circuit of claim 16 wherein said encoding means inserts said substitute components in said output word based on said output word template and inserts said components that have said sum that does not exceed said threshold in said output word based on said output word template.

18. The DC-level constraining circuit of claim 16 wherein said encoding means inserts address symbols in said output word based on said output word template.

19. The DC-level constraining circuit of claim 16 wherein said encoding means inserts indicator symbols in said output word based on said output word template.

20. The DC-level constraining circuit of claim 13 further comprising parity means for adding a parity symbol to said output word to make a product of symbols of said output word positive.

21. The DC-level constraining circuit of claim 13 further comprising parity means for adding a parity symbol to said output word to make a product of symbols of said output word negative.

22. The DC-level constraining circuit of claim 13 wherein said symbols are in an alphabet $\{1, -1\}$, and wherein said output word has a sum between $-17$ and $17$.

23. The DC-level constraining circuit of claim 13 wherein said encoding means encodes said component into a substitute component if said symbols of said component alternate between a positive value and a negative value over said n symbols.

24. The DC-level constraining circuit of claim 13 wherein said encoding means encodes said component into a substitute component if said symbols of said component alternate between a negative value and a positive value over said n symbols.

25. The DC-level constraining circuit of claim 13 wherein said DC-level constraining circuit is implemented in a perpendicular recorder of a data storage system.

26. A DC-level constraining circuit that constrains a DC level of an input word, comprising:
   a summer that sums n symbols of components of said input word and generates a sum for each component;
   a comparator that compares said sum to a threshold; and
   an encoder that encodes said component into a substitute component if said sum for said component exceeds said threshold and one of combines said components having said sum that does not exceed said threshold with at least one substitute component into an output word and outputs said input word as said output word if at least one substitute component is not generated.

27. The DC-level constraining circuit of claim 26 wherein said substitute component includes less than n symbols.

28. The DC-level constraining circuit of claim 26 wherein said input word includes 32 symbols and said output word includes at least 33 symbols, said components include 8 symbols, said threshold is 4, and said substitute component includes 5 symbols.

29. The DC-level constraining circuit of claim 26 wherein said encoder selects an output word template based on a number of substitute components and based on a position that said substitute components originally occupied in said input word.

30. The DC-level constraining circuit of claim 29 wherein said encoder inserts said substitute components in said output word based on said output word template and inserts said components that have said sum that does not exceed said threshold in said output word based on said output word template.

31. The DC-level constraining circuit of claim 29 wherein said encoder inserts address symbols in said output word based on said output word template.

32. The DC-level constraining circuit of claim 29 wherein said encoder inserts indicator symbols in said output word based on said output word template.

33. The DC-level constraining circuit of claim 26 further comprising a parity coder that adds a parity symbol to said output word to make a product of symbols of said output word positive.

34. The DC-level constraining circuit of claim 26 further comprising a parity coder that adds a parity symbol to said output word to make a product of symbols of said output word negative.

35. The DC-level constraining circuit of claim 26 wherein said symbols are in an alphabet $\{1, -1\}$, and wherein said output word has a sum between $-17$ and $17$.

36. The DC-level constraining circuit of claim 26 wherein said encoder encodes said component into a substitute component if said symbols of said component alternate between a positive value and a negative value over said n symbols, and wherein said encoder encodes said component into a substitute component if said symbols of said component alternate between a negative value and a positive value over said n symbols.

37. The DC-level constraining circuit of claim 26 wherein said DC-level constraining circuit is implemented in a perpendicular recorder of a data storage system.

* * * * *

UNITED STATES PATENT AND TRADEMARK OFFICE
CERTIFICATE OF CORRECTION

| | | |
|---|---|---|
| PATENT NO. | : 7,286,065 B1 | Page 1 of 1 |
| APPLICATION NO. | : 11/166425 | |
| DATED | : October 23, 2007 | |
| INVENTOR(S) | : Mats Oberg | |

It is certified that error appears in the above-identified patent and that said Letters Patent is hereby corrected as shown below:

Column 1, Line 41        Insert -- 1 -- after minus symbol

Signed and Sealed this

Twenty-ninth Day of April, 2008

JON W. DUDAS
*Director of the United States Patent and Trademark Office*